US006803564B2

(12) United States Patent
Kawato

(10) Patent No.: US 6,803,564 B2
(45) Date of Patent: Oct. 12, 2004

(54) TIME-OF-FLIGHT MASS SPECTROMETER

(75) Inventor: Eizo Kawato, Souraku-gun (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 10/252,054

(22) Filed: Sep. 23, 2002

(65) Prior Publication Data

US 2003/0102429 A1 Jun. 5, 2003

(30) Foreign Application Priority Data

Nov. 9, 2001 (JP) ....................................... 2001-344071

(51) Int. Cl.[7] ............................ H01J 37/47; H01J 49/40

(52) U.S. Cl. ........................ 250/287; 250/281; 250/288; 250/396 R

(58) Field of Search ................................. 250/281, 282, 250/284, 287, 286, 288, 292, 399, 294, 396 R, 396 AL

(56) References Cited

U.S. PATENT DOCUMENTS 4,611,118 A * 9/1986 Managadze ................. 250/287
4,625,112 A 11/1986 Yoshida ....................... 250/287
4,731,532 A * 3/1988 Frey et al. ................... 250/287
5,168,158 A * 12/1992 McComas et al. ........... 250/287
5,464,985 A 11/1995 Cornish et al. ......... 250/396 R

FOREIGN PATENT DOCUMENTS

WO WO 99/39369 8/1999

OTHER PUBLICATIONS

Mamyrin, B.A. et al., "The mass–reflectron, a new nonmagnetic time–of–flight mass spectrometer with high resolution", Sov. Phys. JETP vol. 37 No. 1, pp 45–48, Jul. 1973.

Kato, M. et al., Function Analyses of the Time–of–Flight Mass Spectrometer with an Electrostatic Reflector–Applications for SIMS and SNMS–,Mass Analysis, vol. 35, No. 4, pp 186–200, Aug. 1987.

Schmid R.P. et al., "Designing reflectron time–of–flight mass spectrometers with and without grids: a direct comparison", International Journal of Mass Spectrometry 206, pp 181–190, 2001.

* cited by examiner

*Primary Examiner*—John R. Lee
*Assistant Examiner*—David A. Vanore
(74) *Attorney, Agent, or Firm*—Westerman, Hattori, Daniels & Adrian, LLP

(57) ABSTRACT

The present invention proposes a time-of-flight mass spectrometer having an ion reflector, which can detect the ions over a wider range of energy while maintaining the resolution, thus improving the ion detection sensitivity by a simple method. In the time-of-flight mass spectrometer, the ion reflector has plural thin plate electrodes and a final electrode. Appropriate voltages are applied to the electrodes so as to construct a first stage with a substantially uniform high electric field strength and a second stage with a substantially uniform low electric field strength. The electric field strength of the second stage is corrected so that it substantially increases at the side of the final electrode.

15 Claims, 4 Drawing Sheets

TIME-OF-FLIGHT MASS SPECTROMETER

The present invention relates to a time-of-flight mass spectrometer. More particularly, the present invention relates to a time-of-flight mass spectrometer having an ion reflector.

BACKGROUND OF THE INVENTION

Time-of-flight mass spectrometers analyze the mass numbers (more exactly, mass-to-charge ratios) of ions by measuring the flight times, i.e. the times that the ions take to travel from the ion source to the ion detector. To improve the accuracy of the analysis of the mass numbers, an ion reflector is used to temporally converge the ions so that the flight times of ions with the same mass number become as equal as possible.

By a known construction of a time-of-flight mass spectrometer, ions created in an ion source are introduced into a field-free drift space and are then reflected by an ion reflector. The ion reflector is composed of a series of parallel plate electrodes, which generates an electric field for reflecting ions back into the field-free drift space. The ions reflected by the ion reflector are detected by an ion detector.

To improve the accuracy of the measurement of flight times, the time deviations of ions due to the initial position should be far smaller than their flight times. Therefore, the ions are often pulsed, or otherwise bunched in time downstream of the ion source. In the initial state, however, the ions have different kinetic energies and hence are diversified in velocity, which causes an undesirable spread of flight times.

The ion reflector is used to compensate for this spread of flight times. Ions with larger initial velocities penetrate deeper into the ion reflector due to their great kinetic energies, where they spend more time before being reflected back into the field-free drift space. In the field-free drift space, on the other hand, the ions spend less time because they have greater velocities. Thus, the increase and the decrease in the flight time cancel each other out. The electric field strength is determined so that the above-described compensation of flight time effectively works over a wide range of initial velocities.

An ion reflector having a uniform (or linear) electric field is called a single-stage reflector. This type of ion reflector can compensate for a spread of flight times only up to the first derivative of ion energy: it can effectively converge the flight times only for a relatively small range of ion energy. Thus, while having been successfully used in many applications, single-stage reflectors are still limited in respect to their ability to compensate for flight times.

To provide a wider range of ion energy compensation, another type of ion reflector, called a dual-stage reflector, uses two stages separated by a fine grid mesh, each stage having a uniform electric field. In the dual-stage reflector, the first stage, which is short in length and has a relatively strong electric field, reduces the energy of ion by more than two thirds. The decelerated ions with their energies being one third or less of the initial energies are reflected in the second stage having a weak electric field. The ions reflected thereby pass through the first stage again, being accelerated there, and return to the field-free drift space. The two stages, working as described above, compensate for the spread of flight times up to the second derivative of ion energy.

The dual-stage reflector was first developed by Mamyrin et al. (B. A. Mamyrin, V. I. Karataev, D. V. Shmikk and V. A. Zagulin, Zh. Eksp. Teor, Fiz. 64 (1973) 82–89; Sov. Phys. JETP., 37 (1973) 45–48). This type of reflector provides the best resolution when the first stage is very short and has an electric field strength much greater than that of the second stage, i.e. when the ratio of the electric field strength of the low-field second stage to that of the high-field first stage is small.

Typically, the first stage is designed to have a length of about 1% of the total length of the reflector. This design is theoretically supported by the fact that the resolution derived from the condition for second order compensation is proportional to the ratio of the ion energy at the boundary of the two stages to the initial ion energy at the front of the reflector.

The maximum value of this ratio is theoretically one third. This value, however, is practically unattainable because it requires the first stage to be infinitely short and the electric field strength to be infinitely great. Therefore, the length of the first stage is chosen as short as possible within a range where no practical problem arises in respect of electric discharge, mesh size effect, etc.

In practice, the amount of energy reduction at the boundary of the two stages is set to be less than about 0.7 of the initial ion energy, which is slightly greater than two thirds, and the aforementioned ratio of the electric fields in the two stages is less than 0.25.

A concise explanation of the dual-stage reflector is available in Mass Analysis, Vol. 35, No. 4 (1987) pp. 186–200. With the average kinetic energy of ions denoted by $U_0$ and the spread of the kinetic energy denoted by $\pm\Delta U/2$, the resolution R under the condition for second order convergence is given by the following approximate equation, which is the third $$R = \frac{32}{3}\left(\frac{U_0}{\Delta U}\right)^3 \times \left(1 - \frac{4l_1}{L}\left(1 + \frac{E_1}{2E_s}\right)\right)$$

derivative of the ion energy:

where L is the length of the field-free drift space, $l_1$ is the length of the first stage, $E_1$ is the electric field strength of the first stage and $E_s$ is the electric field strength in the accelerating region of the ion source. $E_s$ is determined as great as possible to reduce the turn-around time. Therefore, the final term $E_1/(2E_s)$ can be usually ignored.

Dual-stage reflectors have excellent mass resolutions and are effectively applicable to most high-resolution applications currently used. The dual-stage reflector, however, is accompanied by a problem resulting from the use of the mesh or grid, which is necessary to separate the two stages or to separate the reflector from the field-free drift space in order to generate a uniform electric field in each of two stages. That is, the ions need to go through the mesh or grid four times, where they suffer scattering and deflection. This deteriorates the ion detection sensitivity of the apparatus.

U.S. Pat. No. 4,731,532 discloses an ion reflector designed without a grid or a mesh, as shown in FIG. 1, to alleviate the deterioration of the sensitivity.

In this ion reflector, however, the electric field in the first stage is so strong that it penetrates into the second stage or into the field-free drift space, which causes the equipotential surfaces to be bent on both sides of the first stage. This bending of the equipotential surfaces deflects the ions and, as a result, causes a shift of the flight times of the ions.

These effects are corrected by additional electrodes, called the focusing electrodes, attached to the front of the first stage to prevent the ion dispersion.

Another type of grid-less reflector corrects the flight times over a wider range of energy. The ion reflector, disclosed in the U.S. Pat. No. 4,625,112, uses a quadratic electric field to reflect the ions, which, in theory, provides the perfect temporal correction. This ion reflector, however, is very difficult to design because it has no field-free electric field and hence the electric field should be exactly the same as theoretically specified throughout the entire flight path of the ions from the ion source to the ion detector. Furthermore, even when the electric field is quadratic at around the electrodes, the electric field at around the central axis of the reflector is deviated from that field, which makes it difficult to obtain the desired performance. Another ion reflector disclosed in the U.S. Pat. No. 5,464,985 uses a curved electric field.

Each of the two patents embodies a method of determining the electric field strength that is zero or close to zero at the front of the reflector and gradually increases as it goes deeper into the reflector so that the field distortion due to the use of grid-less electrodes becomes small compared to that produced in other grid-less dual-stage reflectors.

The increase of electric field strength along the axis of the reflector, however, yields a small but successive divergence of ions, which deteriorates the sensitivity.

Another type of grid-less reflector corrects the flight times over a wide range of energy without deteriorating the sensitivity. In the grid-less dual-stage ion reflector, disclosed in the International Patent Publication No. WO 99/39369, the ion detection sensitivity is improved by decreasing the electric field strength of the first stage so that the convergence of the ion beam is improved in exchange for a slight deterioration of the resolution. For example, when $l_1/L=0.06$ in the above equation and the spread of energy $\Delta U/U_0$ is the same, the resolution decreases by about 24%.

With these dual-stage reflectors, adequate sensitivities and resolutions can be obtained in various applications. When, however, the ions in their initial positions are broadly distributed within the ion source, the spread of ion energy becomes so large that the resolution rapidly deteriorates. The above equation shows that the resolution is inversely proportional to the third power of the spread of kinetic energy. The resolution is higher than 10,000 when $U_0/\Delta U=10$, while it decreases to 1,333 when $U_0/\Delta U=5$. Therefore, to make the resolution as high as 10,000, the ions in their initial positions must be confined within the space of about ±5% of the acceleration distance in the ion source. This suggests that an increase in the amount of ions in the ion source does not help the improvement of the ion detection sensitivity because some of the ions located distant from the center of the ion source deteriorates the resolution.

With ion reflectors using curved electric field as disclosed in the U.S. Pat. Nos. 4,625,112 and 5,464,985, on the other hand, the condition for the convergence can be satisfied over a wide range of energy, where, however, the ion detection sensitivity cannot be improved because of the strong ion divergence.

In theory, higher orders of energy compensation can be realized by increasing the number of stages so as to incorporate the features of the above-described curved electric field. One document (Reiner P. Schmid and Christian Weickhardt, Intl. J. Mass Spectrometry, Vol. 206 (2001) pp. 181–190) illustrates the change of resolution with the electric field strengths in the first and second stages of the dual-stage reflector as the parameters. As the resolution increases, the adjustment of the parameters becomes a very subtle operation. From this result, it is easy to guess that the addition of just one more parameter will make the empirical adjustment of the parameters so difficult that it will greatly obstruct the application of the reflector to the mass spectrometer.

To solve the above-described problems, the present invention aims to propose a time-of-flight mass spectrometer having an ion reflector, which can detect the ions over a wider range of energy while maintaining the resolution, thus improving the ion detection sensitivity by a simple method.

SUMMARY OF THE INVENTION

As a means for solving the above-described problems, the present invention proposes a time-of-flight mass spectrometer using an ion reflector including a plurality of thin plate electrodes and a final electrode, where:

- voltages are properly applied to the plate electrodes and the final electrode so as to construct a high-field first stage with a substantially uniform electric field and a low-field second stage with a substantially uniform electric field; and
- the electric field strength of the second stage is corrected so that it substantially increases at the side of the final electrode.

An investigation concerning the present invention proved the magnitude of correcting the electric field of the second stage could be 10% or smaller. The electric field strength is gradually increased from an intermediate point of the second stage, and is maximized at around the final electrode. The investigation also empirically proved that the electric field strength should be preferably decreased at the inter-electrode gap immediately before the last. This compensates for the difference in the electric field between the central axis of the reflector and around the thin plate electrode.

It should be noted that the electric field strengths at the inter-electrode gaps do not need to monotonously increase. An electric field fluctuating in strength can still improve the resolution if the average strength increases.

In typical time-of-flight mass spectrometers, the electrodes of the reflector are supplied with voltages generated by dividing a voltage from a power source using resistors. Particularly, in dual-stage reflectrons, a uniform electric field is generated in each of the first stage and the second stage. In each stage, plural resistors of the same resistance are connected in series to generate such voltages that give the same potential difference to the electrodes, which are equally spaced. The reflector according to the present invention corrects the electric field by substantially increasing the resistance of the resistor array of the second stage toward the final electrode.

The correction by the resistance may be accomplished, for example, by changing the resistance of each resistor or by connecting a correction resistor in series to each of resistors having the same resistance. The latter method is preferable practically because it allows separate use of high-precision resistors having a highly uniform resistance and high temperature stability and relatively low-priced correction resistors. Use of the correction resistors makes it impossible for the resistor array to have a resistance lower than that of the high-precision resistor. This might seem a little disadvantageous in view of the fact that the resolution can be higher when the electric field at the inter-electrode gap immediately before the last is set slightly lower than the base electric field of the second stage. Despite that, there is little need to use another high-precision resistor of different resistance because almost the same resolution can be obtained by simply nullifying the resistance of the correction resistor for the above-mentioned inter-electrode gap.

In practical apparatuses, the parts have errors in size, so that the focal point and the resolution need to be adjusted first. The adjustment can be done, without changing the resistances of the correction resistors, by changing the electric field strengths in the first and second stages as in the normal adjustment method of the dual-stage reflectron.

Correction of the electric field may be achieved by using electrode spacers of different thicknesses. Use of spacers of different thicknesses, the production of which requires high precision and hence is costly, is not practically desirable.

Typically, the reflector is placed inclining from the axis of the incident ion beam traveling from the ion source to the reflector. Accordingly, the ion detector is placed off the axis of the incident ion beam. This placement prevents the incident ion beam from colliding with the ion detector. As the inclination of the reflector increases, the flight paths of ions of different energies change differently, which increases the difference in the electric field strengths affecting the ions and hence deteriorates the resolution. Therefore, the inclination of the reflector is determined as small as possible within the range where the ion beam does not interfere with the ion detector.

The ion detector should be oriented so that the detection surface is perpendicular to the central axis of the reflector. The inclination of the ion detector in the direction in which the reflector is inclined can be corrected by changing the electric field strengths of the first and second stages, where, however, the resolution slightly decreases.

DETAILED DESCRIPTION OF A PREFERRED EMBODIMENT

Figure 1:
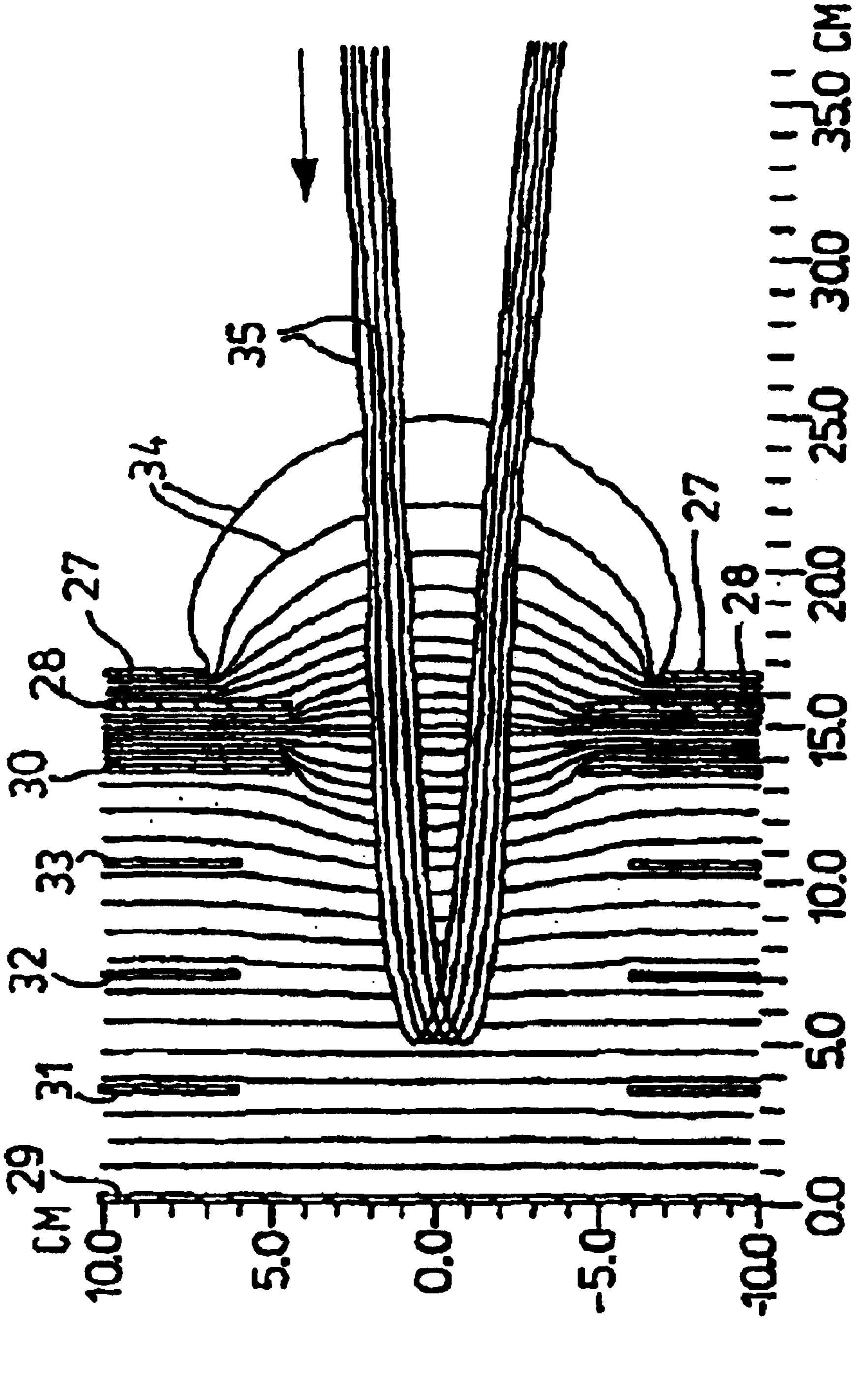
Fig. 1 Prior Art
FIG. 1 is a cross sectional view of a known grid-less dual-stage reflector.
Figure 2:
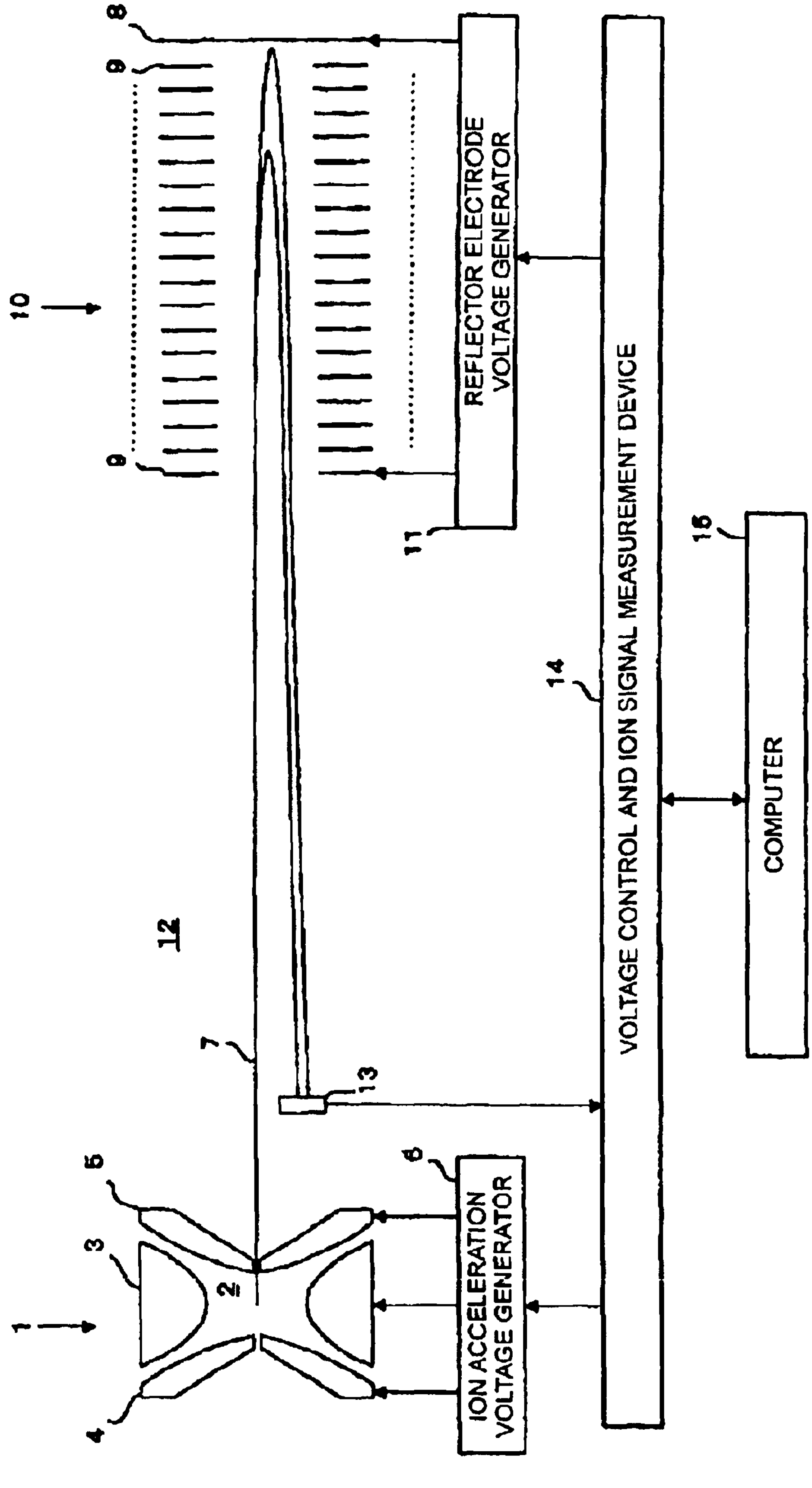
FIG. 2 schematically shows a time-of-flight mass spectrometer according to the present invention.

The following section describes an embodiment of the present invention referring to the drawings. FIG. 2 shows a time-of-flight mass spectrometer according to the present invention with a grid-less dual-stage reflector. This time-of-flight mass spectrometer includes an ion source 1, an ion reflector 10, an ion detector 13 and a field-free drift space 12 between them.

The ion source 1 in this embodiment is a quadrupole ion trap composed of a ring electrode 3 and a pair of end cap electrodes 4, 5. Typically, a radio-frequency (RF) voltage is applied to the ring electrode 3 to trap the ions in the ion trap space 2 formed inside.

To eject the ions into the field-free drift space 12, extraction voltages are supplied from an ion acceleration voltage generator 6 to the electrodes of the ion trap. In this embodiment, the acceleration voltages of 0 V, +5.37 kV and −10 kV are applied to the ring electrode 3, the end cap electrodes 4 and 5, respectively, to accelerate positive ions into the field-free drift space 12 maintained at the potential of −10 kV.

In the field-free drift space 12, ions extracted from the center of the ion trap are accelerated to about 8842 eV in kinetic energy. Ions accelerated from two positions off the center of the ion trap by ±1.2 mm along the central axis, on the other hand, gain 7753 eV and 9864 eV of kinetic energies, respectively, presenting about ±12% of spread of kinetic energy.

The ion beam 7 extracted from the ion source 1 flies through the field-free drift space 12 into the ion reflector 10.

The reflector in this embodiment is a grid-less type composed of plural thin plate electrodes 9 and a final electrode 8. A reflector electrode voltage generator 11 applies an appropriate voltage to each of the electrodes. After entering the reflector, the ions are reflected back to the field-free drift space 12 by an electric field generated inside the reflector.

The ion beam 7 reflected by the reflector 10 again flies through the field-free space 12, reaches the ion detector 13, and produces ion signals. Typically used ion detectors include the micro channel plate (MCP) or the electron multiplier.

The times that the extracted ions take to reach the ion detector are recorded by a voltage control and ion signal measurement device 14, which are converted to a mass spectrum by a computer 15. The total length of the field-free drift space 12 is about 1435 mm, and the flight time of an ion with 10,000 u of mass number is about 179.6 μs.

In this embodiment, the ion reflector 10 is basically designed as a grid-less dual-stage ion reflector, including forty-six pieces of thin plate electrodes 9 with the inner diameter of 37.5 mm and the thickness 2 mm, and a flat final electrode 8. These electrodes are placed at intervals of 5 mm.

The ion reflector is connected to the reflector electrode voltage generator 11 using resistor arrays to generate voltages to be applied to the electrodes.

Figure 3:
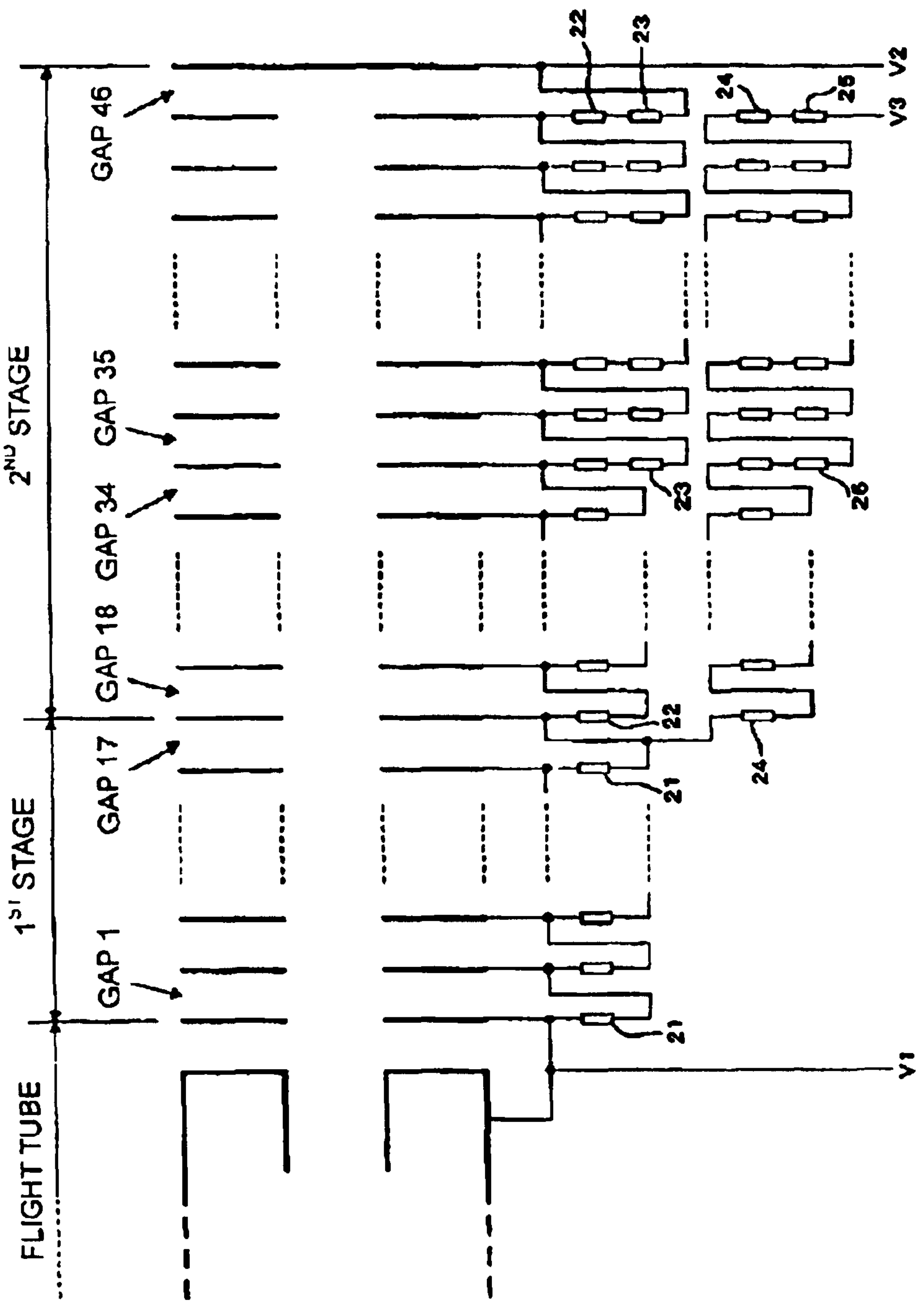
FIG. 3 shows the construction of the reflector according to the present invention and the method of correcting voltages through resistances.

The first stage consists of seventeen gaps, denoted by the numerals 1 to 17 in FIG. 3, and is 85 mm in length. A resistor array 21 composed of resistors having the same resistance generates an electric field with a substantially uniform strength throughout the gaps. The second stage consists of twenty-nine gaps denoted by the numerals 18 to 46, and is 145 mm in length. Similar to the first stage, a resistor array 22 composed of resistors having the same resistance generate an electric field with a substantially uniform strength throughout the gaps. In the final twelve gaps 35 to 46, however, electric field strengths are corrected to be higher than those in the gaps 18 to 34 by an additional resistor array 23 connected in series to a part of the resistor array 22.

In the resistor array 23, the correction resistances are determined so that they substantially increase as the gap is closer to the last one, as shown in Table 1.

TABLE 1

| Gap Number | Resistance |
|---|---|
| 1 to 17 | 30 MΩ |
| 18 to 34 | 30 MΩ |
| 35 | 30 MΩ × 1.0003 |
| 36 | 30 MΩ × 1.0055 |
| 37 | 30 MΩ × 1.0029 |
| 38 | 30 MΩ × 1.0055 |
| 39 | 30 MΩ × 1.0105 |
| 40 | 30 MΩ × 1.0091 |
| 41 | 30 MΩ × 1.0136 |
| 42 | 30 MΩ × 1.0149 |
| 43 | 30 MΩ × 1.0188 |
| 44 | 30 MΩ × 1.0278 |
| 45 | 30 MΩ × 1.0 |
| 46 | 30 MΩ × 1.0354 |

It should be noted that the above set of resistances is only an example, and the resistances can be determined arbitrarily to a certain extent. Table 2, for example, shows another example of resistances.

TABLE 2

| Gap Number | Resistance |
|---|---|
| 1 to 17 | 30 MΩ |
| 18 to 34 | 30 MΩ |
| 35 | 30 MΩ × 1.0009 |
| 36 | 30 MΩ × 1.0028 |
| 37 | 30 MΩ × 1.0047 |
| 38 | 30 MΩ × 1.0066 |
| 39 | 30 MΩ × 1.0085 |
| 40 | 30 MΩ × 1.0104 |
| 41 | 30 MΩ × 1.0123 |
| 42 | 30 MΩ × 1.0142 |
| 43 | 30 MΩ × 1.0200 |
| 44 | 30 MΩ × 1.0286 |
| 45 | 30 MΩ × 1.0 |
| 46 | 30 MΩ × 1.0335 |

The electrode located at the boundary between the first stage and the second stage is connected to resistor arrays 24 and 25, which have the same resistances as those of the resistor arrays 22 and 23, and are connected in parallel to them. The resolution of the reflector is adjusted by three voltages: V1 applied to the first electrode of the first stage, V2 applied to the final electrode and V3 to the end of the resistor arrays 24, 25 connected in parallel. For example, the adjustment is carried out by changing the voltages V2 and V3 while the voltage V1 of the flight tube forming the field-free drift space 12 is fixed at −10 kV.

The differential voltage of V2 and V3 most effectively affects the resolution, as disclosed in the document by Reiner P. Schmid and Christian Weickhardt. The common mode voltage of V2 and V3 does not greatly affect the resolution but only shifts the focal plane back and forth, as described in the International Patent Publication WO 99/39369.

The resistor arrays 24, 25 may be replaced with a smaller number of resistors. Also, instead of adding these resistor arrays, an appropriate voltage may be applied directly to the electrode located at the boundary between the first stage and the second stage.

Figure 4:
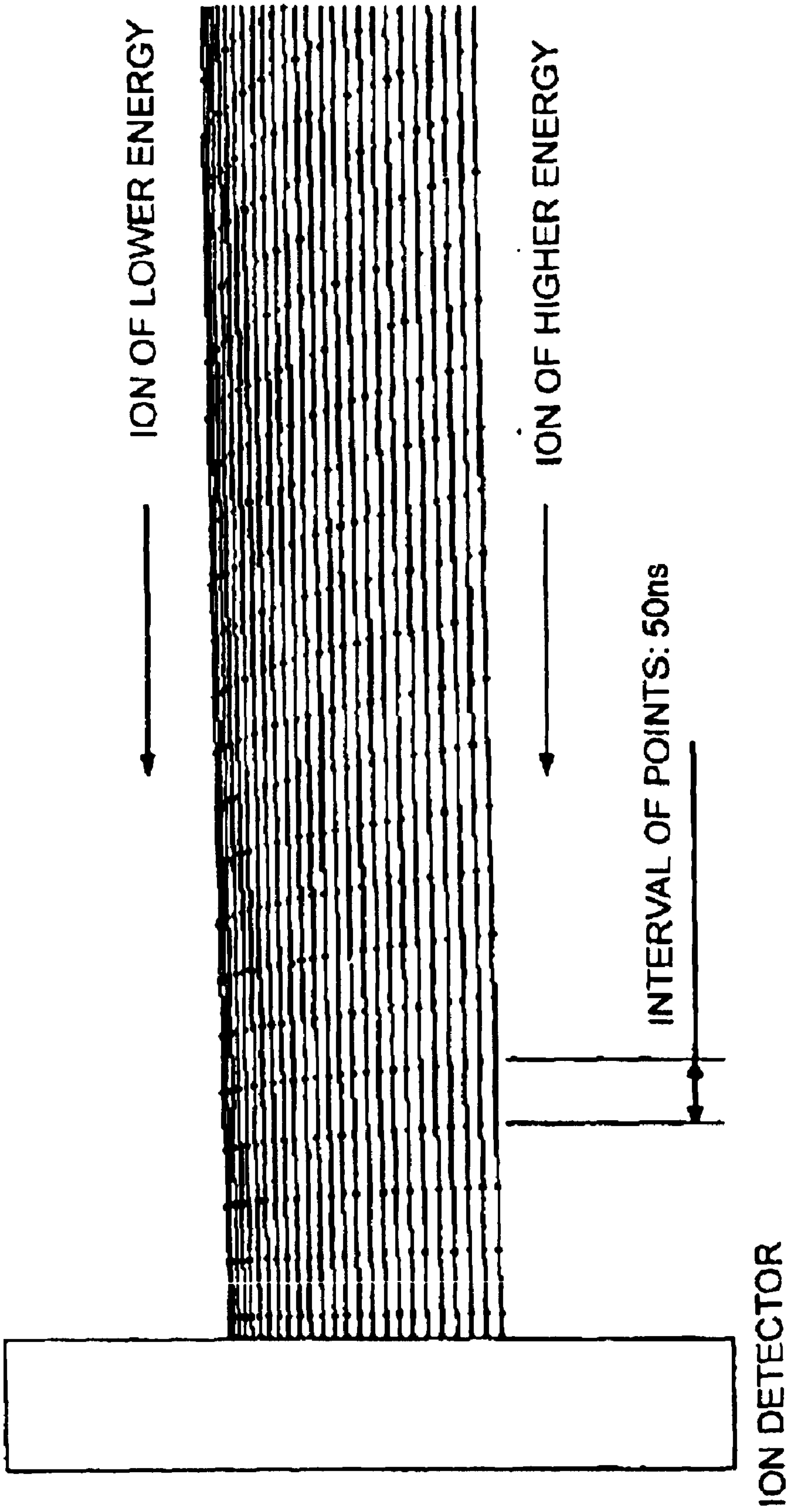
FIG. 4 shows the trajectories of ions immediately before the arrivals at the ion detector calculated by a computer simulation for explaining the time-of-flight mass spectrometer according to the present invention.

FIG. 4 shows the result of a computer simulation with the correction resistances set as shown in Table 1. The figure shows the trajectories of twenty-five ions immediately before their incidence into the ion detector, where the ions are extracted under the condition that they are initially placed on the axis inside the ion source at intervals of 0.1 mm over the range of ±1.2 mm from the center with initial velocities of zero. The points lying on the trajectories are markers plotted for each 50 ns of flight time. FIG. 4 shows the twenty-five ions arriving at the ion detector almost at the same time. The ions are vertically displaced depending on their energies because the central axis of the reflector is inclined from the incident ion beam by 0.77 degree, as easily understood from FIG. 2. The detection surface of the ion detector is oriented to be perpendicular to the ion reflector. The electric field strengths of the first and second stages in this simulation are 65 V/mm and 32 V/mm, respectively.

This simulation showed that the maximum deviation of the flight time of twenty-five ions with 10,000 u of mass number is 0.15 ns, which is equivalent to 600,000 in terms of mass resolution. By conventional dual-stage reflectors, good time convergence is obtained only for such ions that are initially located within about ±0.6 mm from the center of the ion source. The reflector of this embodiment, on the other hand, can temporally converge a much broader range of ions by a slight correction of the electric field in the latter half of the second stage. Thus, the efficiency and sensitivity of ion detection can be greatly improved.

In fact, the mass resolution of a grid-less reflector is affected more greatly by the dispersion of the initial positions of ions in a direction perpendicular to the axis of the ion source than by that in the axial direction. This problem is peculiar to the case where an ion trap is used as the ion source. Ions located away from the axis are hard to spatially converge into a beam when they are ejected into the field-free drift space, and are reflected by the ion reflector at a part distant from the central axis. The equipotential surface of the grid-less reflector is not plane but curved.

In the grid-less reflector disclosed in the International Patent Publication No. WO 99/39369, the ratio of the electric field strength of the first stage to that of the second stage is chosen so as to suppress the dispersion of the reflected ion beam resulting from ions passing near the axis. As for ions passing at a distance from the axis, the dispersion of the reflected ion beam cannot be adequately suppressed, and the ions spread broadly on the detection surface when they arrive at the ion detector, increasing the difference in flight time.

In the ion trap of the present embodiment, the hole of the end cap is enlarged to improve the ion detection efficiency, which is designed to allow the ejection of ions that are initially located within 0.85 mm from the center in the direction perpendicular to the axis. Another computer simulation was performed under the condition that the ions were initially distributed within the aforementioned perpendicular range and also within ±1.2 mm in the axial direction, which showed the divergence in flight time was 5.25 ns, or 17,000 in terms of mass resolution. Also, in the same simulation with the correction resistors as shown in Table 2, the divergence was 5.50 ns. In any case, the mass resolution obtained is high enough for practical use. It should be noted that, when the amount of ions is smaller and hence the ions are trapped closer to the center of the ion source, the mass resolution becomes much higher than the above result because the ions are initially confined in a smaller space.

In the above embodiment, the range of the initial positions of ions is set as large as possible, and the reflector used is a grid-less type. These are all for the improvement of the sensitivity. If, on the other hand, the sensitivity and the detection efficiency may be lower, higher mass resolutions can be obtained instead by applying the present method to a reflector using a grid, by using a parallel plate ion source, or by restricting the initial positions of ions.

Also, in place of the flat final electrode, a final electrode with a dent may be used, as disclosed in the International Patent Publication No. WO 99/39369. This also provides similar effects when the resistance of the resistor at the final gap is corrected.

As described above, the present invention provides a time-of-flight mass spectrometer having an ion reflector, which can detect the ions over a wider range of energy while maintaining the resolution, thus improving the ion detection sensitivity by a simple method.

What is claimed is:

1. A time-of-flight mass spectrometer comprising:

an ion reflector including a plurality of thin plate electrodes each including a respective opening, the openings being aligned, and a final electrode;

a voltage generator applying respective voltages to the plate electrodes and the final electrode so as to generate a first stage with a substantially uniform high electric field strength and a second stage with an approximately uniform low electric field strength, wherein the second stage is adjacent to the final electrode; and wherein the voltage generator comprises a voltage correction for increasing the electric field strength of the second stage at a side of the second stage adjacent to the final electrode.

2. The time-of-flight mass spectrometer according to claim 1, wherein a magnitude of increase of the electric field of the second stage adjacent to the final electrode is less than or equal to 10% of the approximately uniform electric field strength of the second stage without correction.

3. The time-of-flight mass spectrometer according to claim 1, wherein the voltage generator comprises a resistor array, and wherein the correction of the electric field strength in the second stage is accomplished either by increasing a resistance of the resistor array toward the final electrode or by adding a resistor equivalent to an amount of increase of the resistance toward the final electrode.

4. The time-of-flight mass spectrometer according to claim 2, wherein the voltage generator comprises a resistor array, and wherein the correction of the electric field strength in the second stage is accomplished either by increasing a resistance of the resistor array toward the final electrode or by adding a resistor equivalent to an amount of increase of the resistance toward the final electrode.

5. A method of operating a time-of-flight mass spectrometer using an ion reflector including a plurality of thin plate electrodes each including a respective opening, the openings being aligned, and a final electrode, the method comprising the steps of:

applying respective voltages to the plate electrodes and the final electrode so as to generate a first stage with a substantially uniform high electric field strength and a second stage with an approximately uniform low electric field strength, wherein the second stage is adjacent to the final electrode; and correcting the electric field strength of the second stage to increase at a side of the second stage adjacent to the final electrode.

6. The method according to claim 5, wherein a magnitude of increase of the electric field of the second stage adjacent to the final electrode is less than or equal to 10% of the approximately uniform electric field strength of the second stage without correction.

7. The method according to claim 5, wherein the voltages applied to the electrodes to generate the electric fields in the first stage and the second stage are generated by a voltage drop on a resistor array, and wherein the correction of the electric field strength in the second stage is accomplished either by increasing a resistance of the resistor array toward the final electrode or by adding a resistor equivalent to an amount of increase of the resistance toward the final electrode.

8. The method according to claim 6, wherein the voltages applied to the electrodes to generate the electric fields in the first stage and the second stage are generated by a voltage drop on a resistor array, and wherein the correction of the electric field strength in the second stage is accomplished either by increasing a resistance of the resistor array toward the final electrode or by adding a resistor equivalent to an amount of increase of the resistance toward the final electrode.

9. The time-of-flight mass spectrometer according to claim 1, wherein the openings are substantially uniform in configuration.

10. The time-of-flight mass spectrometer according to claim 9, wherein the openings are coaxial circles of substantially uniform diameter.

11. The time-of-flight mass spectrometer according to claim 1, comprising a substantially uniform spacing between the plate electrodes.

12. The method according to claim 5, wherein the openings are substantially uniform in configuration.

13. The method according to claim 12, wherein the openings are coaxial circles of substantially uniform diameter.

14. The method according to claim 1, comprising disposing the plate electrodes with a substantially uniform spacing therebetween.

15. A time-of-flight mass spectrometer comprising:

an ion reflector including a plurality of thin plate electrodes each including a respective opening, the openings being aligned, and a final electrode;

a voltage generator applying respective voltages to the plate electrodes and the final electrode so as to generate a first stage with a substantially uniform high electric field strength and a second stage with an approximately uniform low electric field strength, wherein the second stage is adjacent to the final electrode; and wherein the voltage generator comprises a voltage correction for increasing the electric field strength of the second stage at a side of the second stage adjacent to the final electrode, and the electric field of the second stage is made inhomogeneous.

* * * * *